United States Patent [19]

Weinberg

[11] 4,237,448
[45] Dec. 2, 1980

[54] PAGER WITH ESCALATING AUDIO ALERT SIGNAL LEVEL

[75] Inventor: Morton Weinberg, Plantation, Fla.

[73] Assignee: Motorola, Inc., Schaumburg, Ill.

[21] Appl. No.: 34,302

[22] Filed: Apr. 30, 1979

[51] Int. Cl.$^3$ .................. G08B 27/00; H04M 11/02; H04Q 9/08

[52] U.S. Cl. .................. 340/311; 340/384 E

[58] Field of Search .......... 340/311, 312, 328, 384 E; 325/391, 319, 62, 64

[56] References Cited

U.S. PATENT DOCUMENTS

| | | | |
|---|---|---|---|
| 4,087,793 | 5/1978 | Lucas | 340/312 X |
| 4,145,684 | 3/1979 | Stodolski | 340/311 |

Primary Examiner—Donald J. Yusko

Attorney, Agent, or Firm—Donald B. Southard; James W. Gillman

[57] ABSTRACT

An alerting device, such as a radio pager, which produces an audible alerting signal includes a signal level control which causes the alerting signal to be initially produced at a low audio level, with the signal increasing or escalating to a higher audio level. The signal level can increase continuously in a smooth rise, or can increase in steps. The level control can include an attenuator which initially reduces the signal level, to which a control signal is applied to reduce the attenuation and increase the alerting signal. The attenuator can be coupled to an audio amplifier so that the overall gain of the signal applied to the transducer producing the audible signal is increased from an initial low signal level as the signal continues.

7 Claims, 4 Drawing Figures

PAGER WITH ESCALATING AUDIO ALERT SIGNAL LEVEL

BACKGROUND OF THE INVENTION

Radio paging devices are used in many applications to alert a user that he is being called. Such devices generally produce an audible alerting signal which can be heard by the user. However, an audible signal is objectionable in some places, and may not be heard in places where there is a high ambient noise level. A manual level control can be provided to change the level for different situations, but such a manual control is objectionable as the user may forget that the level control is set at a high level so the alerting signal produces a disturbance, or may leave the control at a low level so that the alerting signal is not heard.

To eliminate the use of an audible signal in places where this is objectionable, pagers have included vibrating devices so that the user of the pager feels, rather than hears, the alerting signal. This is only effective when the pager is worn directly on the body of the user. Also, memory devices have been used to store a call which is received, so that an audible alerting signal is not required. It is then necessary for the user to interrogate the pager when he is free to do this. This is objectionable as it requires additional equipment, and that the user remembers it interrogate his pager frequently.

SUMMARY OF THE INVENTION

It is an object of this invention to provide a pager which produces an audible alerting signal which starts at a low audible level and then rises to a higher audio level.

Another object of this invention is to provide a paging device which produces an electrical tone signal for driving an alerting transducer which is initially at a low signal level, and wherein the signal level increases to a much higher level as the alerting signal continues.

A further object of the invention is to provide a paging device including a decoder which responds to a particular code signal to initiate an electrical tone signal for driving an audio transducer, and wherein the tone signal rises from a low level to a higher level following the decoder response.

A still further object of the invention is to provide a signal translating circuit for the electrical alerting signal of a pager which includes an attenuator and an amplifier for controlling the signal level so that the alerting signal is initially applied to an audio transducer at a low signal level and then increased to provide a higher level alerting signal.

In accordance with the invention, a radio pager adapted to be carried by a user, as in a pocket or clipped to a belt, produces an audible alerting signal which starts at a low sound level and then increases to a higher level until the pager is reset. The pager includes a decoder which responds to a particular code signal to initiate operation of a generator of an electrical tone signal. The electrical signal is applied through a level control translating circuit to an audio transducer (loudspeaker) which produces the audible alerting signal. The level control circuit includes an attenuator coupled to the decoder to initially reduce the level of the electrical signal so that the audible alerting signal starts at a low level. The control circuit responds to the signal from the decoder to reduce the attenuation so that the alerting tone becomes louder as it continues. The reduction in attenuation can be a smooth gradual change, or in steps until the maximum audio output is produced. The translating circuit can include an amplifier coupled to the adjustable attenuator to increase the level of the electrical signal, with the overall gain of the translating circuit increasing following the response of the decoder to the particular code signal.

DETAILED DESCRIPTION OF A PREFERRED EMBODIMENT

Figure 1:
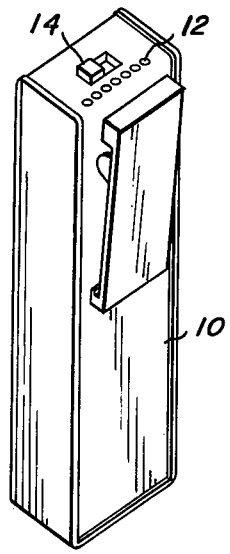
FIG. 1 is a perspective view of a radio pager which utilizes the escalating alerting signal of the invention.

FIG. 1 illustrates a radio pager 10, the general shape and appearance of which can be the same as that of any known radio pager. The pager 10 includes a grill 12 through which an audible alerting tone signal produced by the pager is transmitted so that it can be heard by the user. The pager 10 also includes a control 14 to reset the pager when the user hears the alerting signal. This reset operation is in common usage and is well known in the art. An automatic resetting circuit which operates when the alerting signal has continued for a given time period is also known and can be used with the pager 10.

Figure 2:
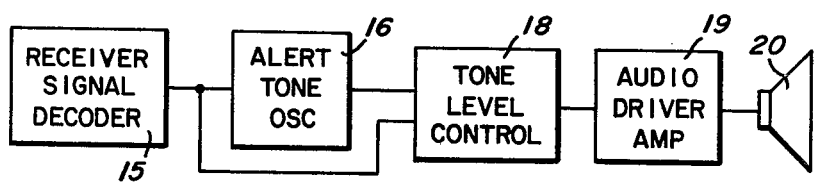
FIG. 2 is a block diagram of the alerting signal system of the invention.

FIG. 2 illustrates the system of the pager 10 which includes a radio receiver 15 which may operate at a radio frequency in a range of radio frequencies used for this purpose. The receiver 15 includes a signal decoder which responds to a code signal which is unique to an individual pager. The code signal can be of any known type, such as a pulse or frequency code signal. Alternatively, the decoder can be common to a group of pagers, all of which respond to the same code signal. The pager 10 also includes an alert tone generator or oscillator 16 which produces an electrical tone signal in the audible frequency range. The receiver 15 with a decoder, and the alert tone oscillator 16 can be of known construction and can operate in the manner commonly utilized in radio pagers.

In accordance with the invention, the electrical signal from oscillator 16 is applied through a translating circuit including level control 18 and audio driver amplifier 19 to the audio transducer 20, which can be a loudspeaker. The tone level control 18 can attenuate the level of the elctrical tone signal so that the alerting signal produced by transducer 20 is initially at a low audible level which can just be heard in a quiet place. The control 18 is coupled to the decoder of the receiver 15 and responds to the decoder output so that following the receipt of the calling code signal, the attenuation of the electrical signal is reduced and the transducer 20 produces a louder alerting sound signal. The action of the level control 18 can be to gradually increase the level of the audible alerting signal, or to increase the same in discrete steps.

Figure 3:
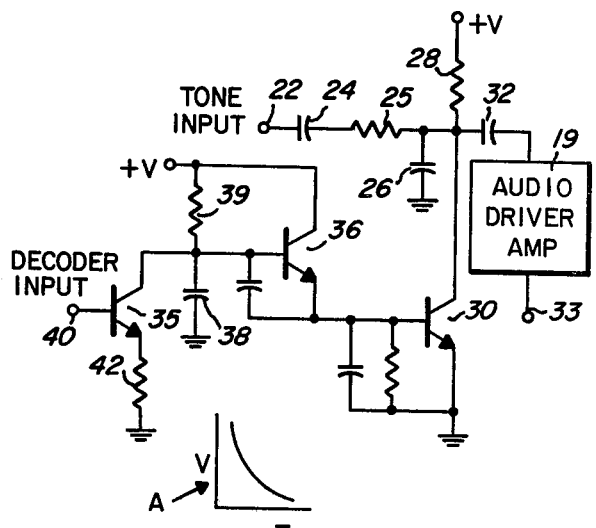
FIG. 3 illustrates one embodiment of the signal level control in the system of FIG. 2.

FIG. 3 illustrates one embodiment of a circuit which can be used as the signal translating circuit 18, 19 in the system of FIG. 2. The electrical tone signal from oscillator 16 is applied to input terminal 22, and through the input filter including capacitor 24, resistor 25 and capacitor 26. The signal across capacitor 26 is applied to an attenuator or voltage divider including resistor 28 and the collector-emitter path of transistor 30. The signal from the attenuator is coupled through capacitor 32 to audio driver amplifier 19 which provides the output at terminal 33 to drive transducer 20 of the system of FIG. 2.

The conduction of transistor 30 in the circuit of FIG. 3 is controlled by a circuit including transistors 35 and 36. In the normal or initial condition, capacitor 38 is charged to the +V potential through resistor 39. This applied a potential to the base electrode of transistor 36 which causes this transistor to conduct fully, and this drives transistor 30 into full conductance so that the collector-emitter path thereof presents a low impedance. This acts to shunt the signal across capacitor 26 so that the signal automatically applied through capacitor 32 to the audio amplifier 19 is at an increasingly low level.

When the code signal to which the decoder of receiver 51 responds is received, the decoder applies a control voltage to the decoder input 40 of FIG. 3. This causes transistor 35 to conduct to discharge capacitor 38 through its collector-emitter path in series with resistor 42. The value of resistor 42 can be related to the value of capacitor 38 to control the rate of discharge of capacitor 38 to thereby control the voltage applied to the base electrode of transistor 36. The voltage across capacitor 38 is illustrated by Curve A chown in FIG. 3 adjacent to this capacitor. As the voltage applied to the base electrode of transistor 36 drops, the conduction of this transistor reduces and this in turn causes transistor 30 to conduct less so that the resistance of its collector-emitter path rises. This reduces the shunting effect on the electrical signal applied through capacitor 32 to the audio amplifier 19, so that the signal at output terminal 33, which is applied to the loudspeaker 20, increases and the audible alerting signal increases or escalates.

It will be apparent that as the voltage across capacitor 30 (Curve A) drops in a smooth exponential curve, the sound level of the audio alerting tone will increase at a smooth gradual rate. This will continue to the point where the collector-emitter path of transistor 30 approaches an open circuit, so that there is no shunting effect on the signal across capacitor 26. The full elecrical signal applied through the input filter will be applied to the audio amplifier 19 to provide a maximum signal level at output terminal 33.

Figure 4:
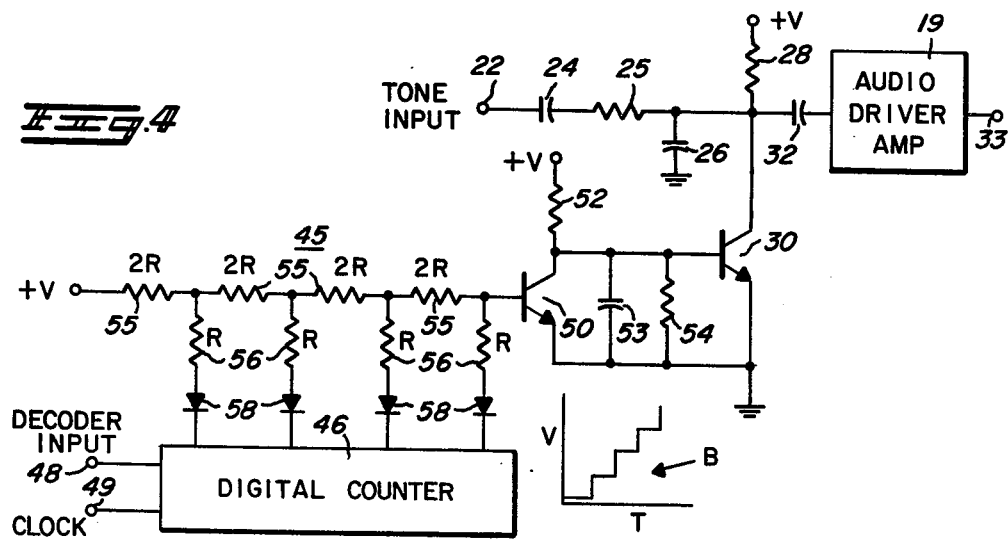
FIG. 4 illustrates a second embodiment of the signal level control in the system of FIG. 2.

FIG. 4 shows a second embodiment of a signal translating circuit in accordance with the invention. This includes the same input terminal 22 and input tone filter 24, 25, 26 as in FIG. 3, and resistor 28 and transistor 30 from an attenuator, as has been described. However, transistor 30 is controlled in a different way, so that the resistance of its collector-emitter path is increased in steps. This action is produced by use of a known resistor ladder 45 which is coupled to digital counter 46. The decoder voltage produced when a particular code signal is received by receiver 15 is applied to enable input 48 of the counter 46. A clock signal is applied to the clock input 49 of counter 46 to step the same when it is enabled. The resistor ladder 45 produces a rising step voltage, shown by Curve B, which is applied to the base electrode of transistor 50. Transistor 50 is initially nonconductive so that the +V voltage is applied through the resistive divider formed by resistors 52 and 54 to capacitor 53. This voltage across capacitor 53 is applied to the base electrode of transistor 30 and initially holds this transistor fully conductive so that the collector-emitter path shunts the signal across capacitor 26. When counter 46 is enabled by the decoder voltage applied to terminal 48, the voltage from the resistor ladder 45 (Curve B) renders transistor 50 conductive in steps to reduce the conduction of transistor 30 in the same way, and thereby reduce the shunting effect on capacitor 26.

The resistor ladder 45 is of the type commonly called an R-2R ladder, with the series resistors 55 having a value twice that of the shunt resistors 56. Each of the shunt resistors 56 is connected to a terminal of counter 46 through a diode 58. As the counter 46 steps, the shunt branches are opened in turn until the maximum voltage is produced and applied to the base electrode of transistor 50.

The system described provides an alerting signal which is effective to alert the user without producing an objectionable disturbance. In a quiet area, the low level signal can be heard and the pager can be reset manually before full output level is reached. This provides minimum disturbance and low power use. When the low level signal is not heard, the sound will increase or escalate, either continuously or in steps until maximum level is reached. The pager may employ either manual reset or automatic time-out reset of the alert signal. No manual setting of the audio output level is required.

What is claimed is :

1. A control system for the audible alerting signal of paging apparatus which includes a decoder responsive to a received code for producing an output, a generator responsive to the decoder output for producing an electrical tone signal, and an audio transducer for producing the audible alerting signal from the electrical tone signal, said control system including in combination:
   signal translating means connecting the generator to the audio transducer for applying the electrical tone signal to the transducer; and
   level control means connected to said signal translating means and coupled to the decoder, said level control means causing said signal translating means to apply the electrical signal to the audio transducer at an initial low level and being responsive to the decoder output to cause said translating means to apply the electrical signal to the audio transducer at a higher level as the signal continues.

2. A control system in accordance with claim 1 wherein said signal translating means includes a signal attenuator, and said level control means applies a control signal to said attenuator for reducing the attenuation thereof.

3. A control system in accordance with claim 2 wherein said level control means applies a continuously variable control signal to said attenuator for reducing the attenuation thereof, so that the electrical signal applied to the transducer increases gradually.

4. A control system in accordance with claim 2 wherein said level control means applies a step wave control signal to said attenuator for reducing the attenuation thereof in steps, so that the electrical signal applied to the transducer increases in steps.

5. A control system in accordance with claim 1 wherein said signal translating means includes amplifier means for applying the elctrical tone signal to the audio transducer and adjustable means connected to said level control means and controlled thereby for increasing the level of the tone signal applied to the audio transducer.

6. A control system in accordance with claim 5 wherein said level control means responds to the decoder output to apply a continuously variable control signal to said adjustable means to control the level of the tone signal.

7. A control system in accordance with claim 5 wherein said level control means responds to the decoder output to apply a step wave control signal to said adjustable means to control the level of the tone signal.

* * * * *

UNITED STATES PATENT AND TRADEMARK OFFICE
CERTIFICATE OF CORRECTION

PATENT NO. : 4,237,448

DATED : December 2, 1980

INVENTOR(S) : Morton Weinberg

It is certified that error appears in the above—identified patent and that said Letters Patent is hereby corrected as shown below:

Column 2, line 53, delete "elctrical" and insert --electrical--.

Column 3, line 12, delete "applied" and insert --applies--.

Column 3, line 45, delete "elecri-" and insert --electri- --.

Column 4, line 44, insert the word --automatically-- before the word "apply".

Column 4, line 45, delete the word "a", and insert --an increasingly--.

Column 4, line 63, delete "elctrical" and insert --electrical--.

Signed and Sealed this

Fourth Day of August 1981

[SEAL]

Attest:

Attesting Officer

GERALD J. MOSSINGHOFF

Commissioner of Patents and Trademarks